United States Patent [19]

Miller

[11] Patent Number: 5,450,356
[45] Date of Patent: Sep. 12, 1995

[54] PROGRAMMABLE PULL-UP BUFFER

[75] Inventor: Charles R. Miller, Shickshinny, Pa.

[73] Assignee: AT&T Corp., Murray Hill, N.J.

[21] Appl. No.: 329,028

[22] Filed: Oct. 25, 1994

[51] Int. Cl.6 .............................................. G11C 13/00
[52] U.S. Cl. .................. 365/189.05; 365/177;
365/189.11; 326/58; 326/121; 327/391;
327/437
[58] Field of Search ............. 365/189.05, 177, 189.11;
327/185, 391, 437; 326/121, 58, 83

[56] References Cited

U.S. PATENT DOCUMENTS

| | | | |
|---|---|---|---|
| 4,789,967 | 12/1988 | Liou et al. | 365/189 |
| 4,961,168 | 10/1990 | Tran | 365/189.11 |
| 5,206,545 | 4/1993 | Huang | 307/443 |
| 5,239,237 | 8/1993 | Tran et al. | 365/189.05 |
| 5,291,080 | 3/1994 | Amagasaki | 307/475 |
| 5,293,082 | 3/1994 | Bathaee | 326/121 X |
| 5,305,443 | 4/1994 | Franzo | 395/325 |
| 5,331,593 | 7/1994 | Merritt et al. | 365/189.11 |
| 5,384,735 | 1/1995 | Park et al. | 365/189.05 |

*Primary Examiner*—Do Hyun Yoo
*Attorney, Agent, or Firm*—David L. Smith

[57] ABSTRACT

There is disclosed an integrated circuit having a buffer that includes an output driver for receiving data and for transferring the data to an output node to be placed on a bus. The buffer also includes a pull-up control device coupled to the output node. The control device is capable of being switched between a first state that couples the output node to a predetermined logic level and a second state that does not couple the output node to the predetermined logic level. Control logic coupled to the pull-up control device receives first and second logic signals to control the state of the control device. With the second logic signal in a first predetermined level, the first logic signal is capable of switching the control device to the first state when in a first predetermined state and to the second state when in a second predetermined state. The second logic signal when in a second predetermined level overrides the control of the first logic signal to maintain the control device in the second state.

15 Claims, 3 Drawing Sheets

ID="5,450,356"

PROGRAMMABLE PULL-UP BUFFER

TECHNICAL FIELD

This invention relates generally to buffers useful in integrated circuits and more particularly to a programmable pull-up buffer for transferring data between an integrated circuit and a bus.

BACKGROUND OF THE INVENTION

It is desirable in a system with a bus shared by multiple devices to return the bus to a logic high when the bus is not being actively driven by a device. Each device typically includes a pull-up transistor cooperative with a buffer to pull-up the bus to a logic high. Maintaining the bus at a logic high when data is not being driven onto the bus avoids undesirable floating inputs which consume power and cause devices coupled to the bus to be susceptible to noise. When the next device to drive data onto the bus becomes active, the initial state of the bus is known. Furthermore, the active device must overcome the pull-up current of all other devices on the bus. To overcome the pull-up current of all other devices on the bus necessitates sinking a large amount of current. Sinking current requires time which slows operation of the bus and unnecessarily consumes power.

SUMMARY OF THE INVENTION

In accordance with an illustrative embodiment of the invention, an integrated circuit includes a buffer. The buffer includes an output driver for receiving data and for transferring the data to an output node to be placed on a bus. The buffer also includes a pull-up control device coupled to the output node. The control device is capable of being switched between a first state that couples the output node to a predetermined logic level and a second state that does not couple the output node to the predetermined logic level. Control logic receives first and second logic signals to control the state of the control device. With the second logic signal in a first predetermined logic level, the first logic signal is capable of switching the control device on when in a first predetermined state and off when in a second predetermined state. The second logic signal when in a second predetermined logic level overrides the control of the first logic signal to maintain the control device in the second state.

DETAILED DESCRIPTION

Figure 1:
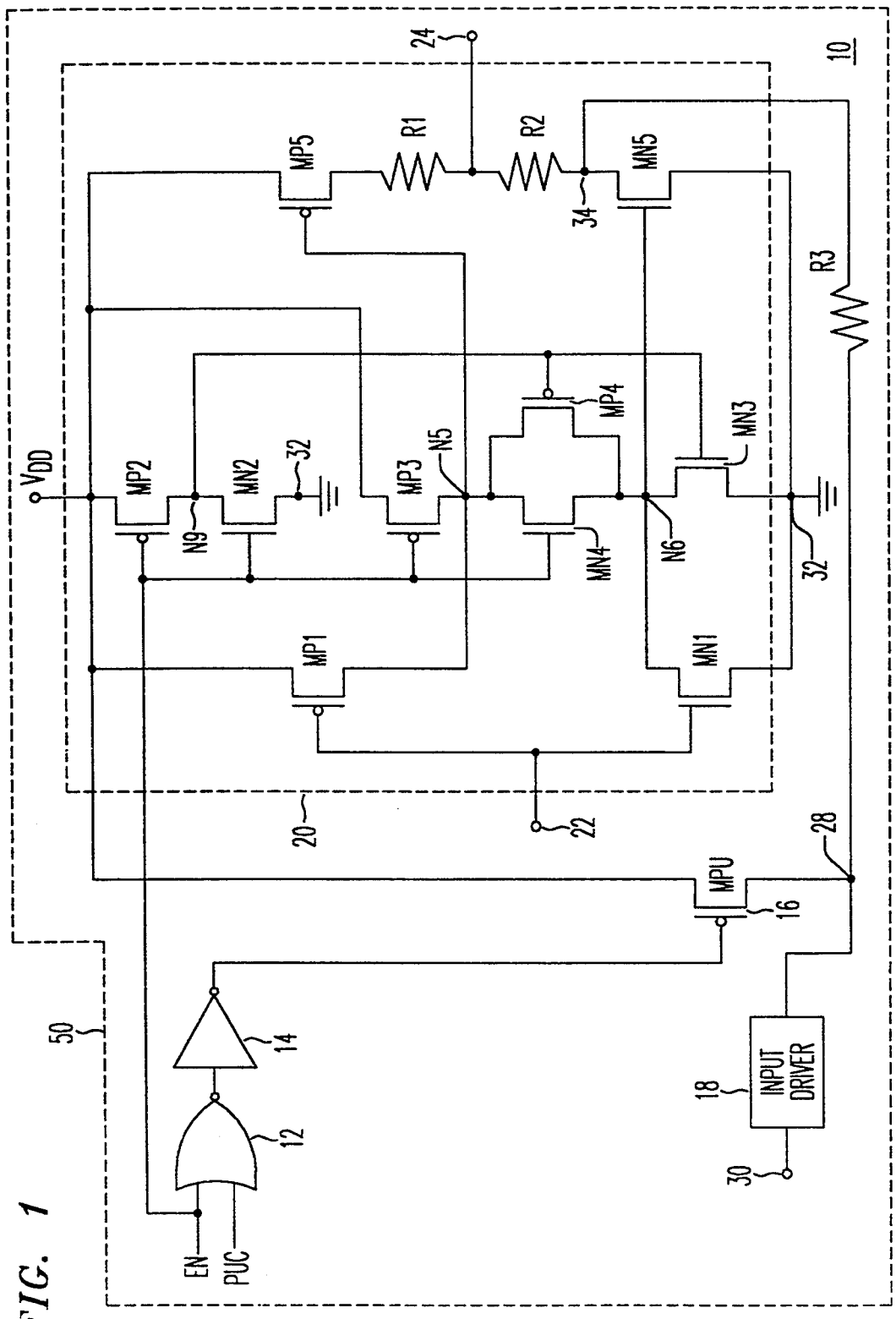
FIG. 1 is a schematic diagram of a buffer in accordance with an illustrative embodiment of the invention.

FIG. 1 shows a schematic diagram of a bidirectional buffer 10, also known as an input/output buffer, in accordance with an illustrative embodiment of the invention. Buffer 10 is part of an integrated circuit 50 and provides a buffer between data on the integrated circuit that is being transferred off of the integrated circuit, or data external to the integrated circuit that is being transferred onto the integrated circuit.

Buffer 10 includes NOR gate 12 which receives two logic level control signals EN and PUC. The output of NOR gate 12 is coupled to provide the input to inverter 14. The output of inverter 14 is coupled to an electrode of a control device 16. The control device 16 is shown as a P-channel transistor, MPU, with inverter 14 coupled to the gate. The source and drain of transistor MPU are coupled between $V_{DD}$ and the input node 28 of input driver 18. One of the logic level control signals, EN, also provides an input to output driver 20.

Output driver 20 receives data at input node 22 for transfer to output node 24. The data is in the form of a sequence of high and low logic levels. Output node 24 is coupled to a pad (not shown) which in turn is coupled to a pin (not shown) on the integrated circuit package. By transferring data presented at the input node 22 from input node 22 to output node 24, data is transferred off of the integrated circuit to a bus, such as bus 26 shown in FIG. 2.

Output node 24 is coupled to input node 28 of input driver 18 through resistors R2 and R3. Input driver 18 takes data off of the bus, buffers the data, and provides the data at output node 30 for use within the integrated circuit.

Output driver 20 includes P-channel transistors MP1, MP2, MP3, MP4, and MP5, as well as N-channel transistors MN1, MN2, MN3, MN4, and MN5. Transistors MP2 and MN2 are coupled between power source $V_{DD}$ and a reference potential 32, such as ground. The source of transistor MP2 is coupled to power source $V_{DD}$. The drain of transistor MP2 is coupled to the source of transistor MN2 and defines node N9. The drain of transistor MN2 is coupled to reference potential 32. Transistors MP2 and MN2 each has a gate coupled to an input of NOR gate 12 to receive control signal EN.

Transistors MP3, MP4, MN4, and MN3 are coupled between power source $V_{DD}$ and reference potential 32. The source of transistor MP3 is coupled to power source $V_{DD}$. The drain of transistor MP3 is coupled to the source of both transistors MP4 and MN4, defining node N5. The drain of both transistors MP4 and MN4 are coupled to the source of transistor MN3, defining node N6. The drain of transistor MN3 is coupled to reference potential 32. Transistors MP3 and MN4 each has a gate coupled to an input of NOR gate 12 to receive control signal EN. Transistors MP4 and MN3 each has a gate coupled to node N9.

Transistors MP5 and MN5 are coupled between power source $V_{DD}$ and reference potential 32. The source of output transistor MP5 is coupled to power source $V_{DD}$. Resistor R1 is coupled between the drain of output transistor MP5 and output node 24. The gate of output transistor MP5 is coupled to node N5. Resistor R2 is coupled between output node 24 and the source of output transistor MN5. Node 34 is defined at the junction of resistor R2 and the source of output transistor MN5. The drain of output transistor MN5 is coupled to reference potential 32. The gate of output transistor MN5 is coupled to node N6. Resistor R3 is coupled between nodes 34 and 28. Resistors R1 and R2 are impedance matching resistors, typically in the range of 30 ohms, to match a 50 ohm bus. Resistor R3, typically in the range of 1 kilo-ohm, provides electrostatic discharge protection.

The source of transistor MP1 is coupled to power source $V_{DD}$ and the drain of transistor of MP1 is coupled to node N5. The source of transistor MN1 is coupled to node N6 and the drain of transistor MN1 is coupled to reference potential 32. The gates of transistors MP1 and MN1 are common and coupled to input node 22.

In operation, when PUC is a logic low and EN is a logic low, the output of NOR gate 12 is a logic high, the output of inverter 14 is a logic low and pull-up transistor MPU is turned on. As a result of EN being a logic low, transistors MP2 and MP3 are in the on state and transistors MN2 and MN4 are in the off state. Node N9 is held at a logic high which turns off transistor MP4 and turns on transistor MN3. Transistor MN3 being turned on causes node N5 to be driven to a logic high, which turns off transistor MP5 and node N6 to be driven to a logic low, which turns off transistor MN5. Since both output transistors MN5 and MP5 are turned off, the output is in the tri-state condition. Pull-up transistor MPU is in the on state and actively pulling node 24, and hence the pad, to a logic high.

When EN transitions to a logic high as would occur when this device takes control to drive the bus, PUC remains a logic low. The output of NOR gate 12 is a logic low. The output of inverter 14 is a logic high and pull-up transistor MPU is turned off so output driver 20 can drive the bus without wasting power internally. As a result of EN being a logic high, transistors MP2 and MP3 are in the off state and transistors MN2 and MN4 are in the on state. Node N9 is held in a logic low which turns on transistor MP4 and turns off transistor MN3. Transistor MN3 being turned off causes nodes N5 and N6 to short together. Transistors MP1 and MN1 operate as a first inverter to invert the data inputted at node 22. Transistors MP5 and MH5 operate as a second inverter to invert, for a second time, the data inputted at node 22, returning the data to its original state at output node 24. Pull-up transistor MPU is turned off permitting output driver 20 to drive the bus without wasting power internally.

Figure 2:
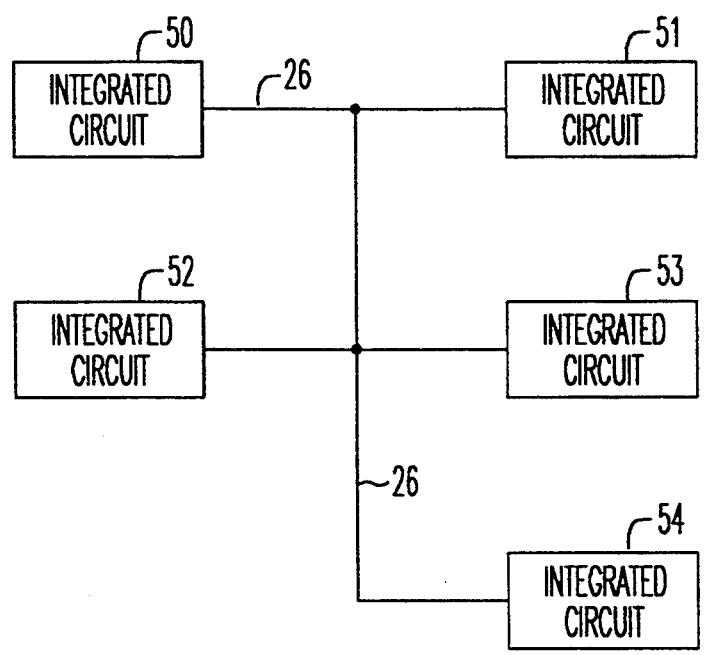
FIG. 2 is a schematic diagram of a system of several integrated circuits coupled to a bus.

When control is to be transferred to another integrated circuit, such as 51, 52, 53 or 54 in FIG. 2, to drive the bus, PUC transitions to a logic high. Without regard to the state of EN, when PUC transitions to a logic high, the output of NOR gate 12 is either a logic low or transitions to a logic low. The output of inverter 14 is a logic high which causes pull-up transistor MPU to be turned off, thereby causing no need for another integrated circuit driving the bus to sink current from transistor MPU of this and other such devices. In this manner, control signal PUC takes precedence over control signal EN to drive pull-up transistor MPU to the off state or to maintain pull-up transistor MPU in the off state.

The illustrative embodiment of the invention is particularly useful in system applications employing several integrated circuits 50, 51, 52, 53 and 54, coupled to bus 26, as shown in FIG. 2. Such integrated circuits might be microprocessors, microcontrollers, or digital signal processors. At a system level, once an integrated circuit, such as integrated circuit 50, that has driven data onto bus 26 ceases driving data onto the bus, the pull-up control is permitted to be transferred to another one of the integrated circuits that is driving the bus. Transferring pull-up control to another integrated circuit is achieved by turning off transistor MPU in integrated circuit 50 simultaneously with or a few milliseconds after integrated circuit 50 ceases driving the bus. Transistor MPU is turned off by causing control signal PUC to be a logic high. PUC is programmable by writing to a register in integrated circuit 50. The register can be written to change PUC after the passage of a period of time, such as after a predetermined number of instructions of code are executed following writing data onto bus 26.

Figure 3:
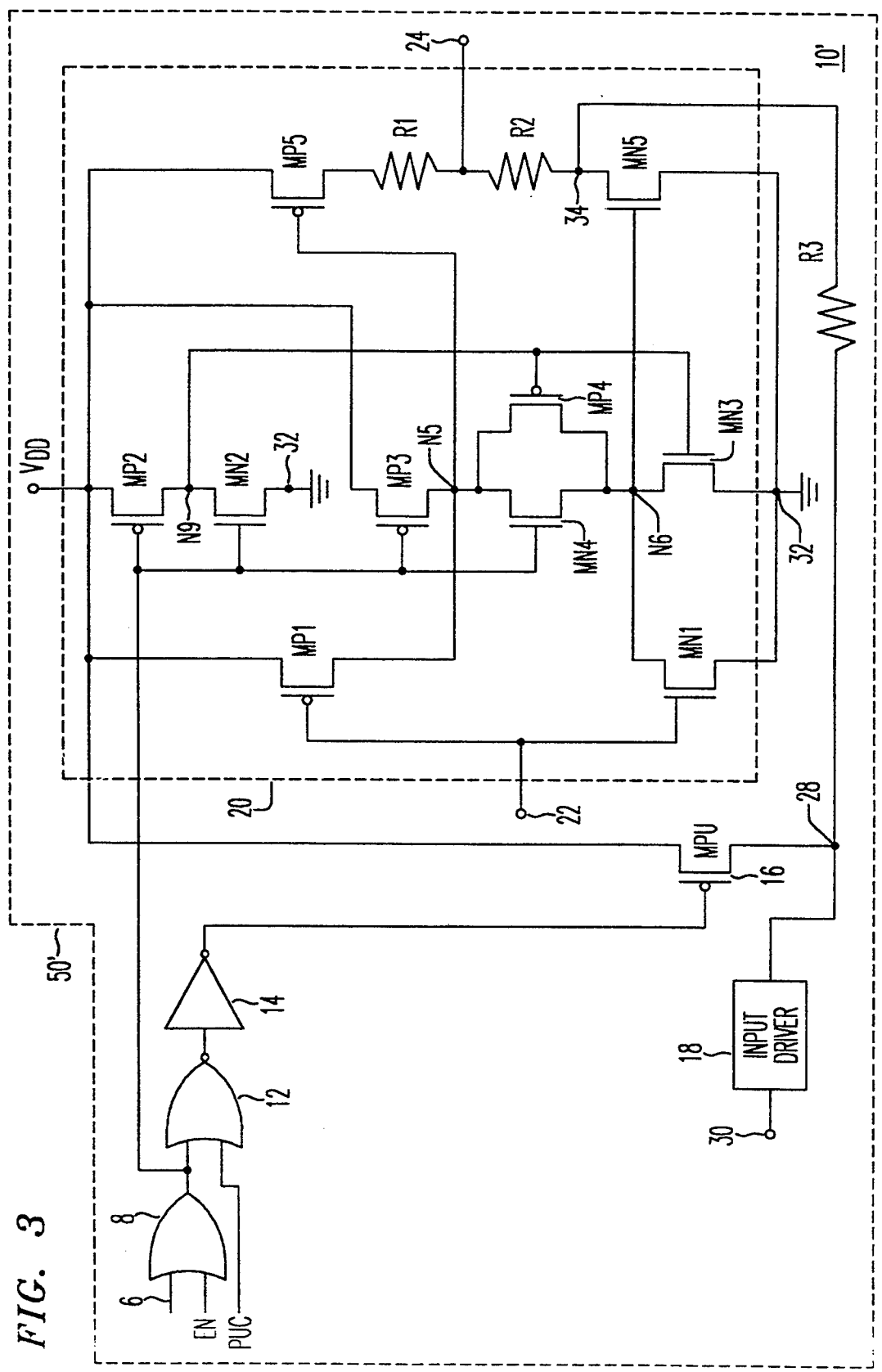
FIG. 3 is a schematic diagram of an alternative illustrative embodiment buffer.

FIG. 3 is a schematic diagram of an alternate embodiment buffer 10' in which a logic level control signal from either within or outside integrated circuit 50' functions to control transistor MPU. The logic level control signal is provided as input 6 to OR gate 8, with logic level control signal EN provided as the other input to OR gate 8. The output of OR gate 8 is coupled where EN was coupled in FIG. 1, as an input to NOR gate 12 and as an input to output driver 20. By including OR gate 8, another control signal on integrated circuit 50' or a control signal from outside integrated circuit 50' can turn off transistor MPU. A control signal outside integrated circuit 50' may be brought into integrated circuit 50' through a pin or an interrupt.

While the illustrative embodiment of the invention has been described using p-channel transistors and n-channel transistors being switched to on and off states by logic high and logic low signals, one skilled in the art could design a circuit to achieve the same function in which the logic states differ from those in the illustrative embodiment.

While the illustrative embodiment of the invention has been described as a buffer useful for transferring data between an integrated circuit and a bus, the invention is applicable to a buffer that is only an output buffer. Furthermore, it is also contemplated as being within the scope of the invention that as levels of integration increase, e.g., more and more circuit functions are manufactured on a single chip, that all or part of the bus may be on the same chip as the buffer.

I claim:

1. An integrated circuit including a buffer, the buffer comprising:
   an output driver, the output driver having an input node at which data is received and an output node at which the data is presented, the output driver for receiving the data and for transferring the data to the output node to be placed on a bus;
   a pull-up control device coupled to the output node, the control device capable of being switched between a first state that couples the output node to a predetermined logic level and a second state that does not couple the output node to the predetermined logic level; and
   control logic coupled to the pull-up control device for receiving first and second logic signals to control the state of the control device, with the second logic signal in a first predetermined level the first logic signal being capable of switching the control device to the first state when in a first predetermined state and to the second state when in a second predetermined state, the second logic signal when in a second predetermined level overriding the control of the first logic signal to maintain the control device in said second state, whereby either the first or second logic signals are capable of switching the control device to said second state, with the second logic signal overriding the first logic signal in such control.

2. An integrated circuit as recited in claim 1, wherein the pull-up control device is a transistor.

3. An integrated circuit as recited in claim 1, wherein the predetermined logic level is a logic high.

4. An integrated circuit as recited in claim 1, wherein the first predetermined state is a logic low.

5. An integrated circuit as recited in claim 1, wherein the second predetermined state is a logic high.

6. An integrated circuit including a buffer, the buffer comprising:

an output driver, the output driver having an input node at which data is received and an output node at which the data is presented, the output driver for receiving the data and for transferring the data to the output node to be placed on a bus;

an input driver for receiving data from the output node, the input driver having an input port coupled to the output node, and an output port at which data is presented;

a pull-up control device coupled to the output node, the control device capable of being switched between a first state that couples the output node to a predetermined logic level and a second state that does not couple the output node to a predetermined logic level; and control logic coupled to the control device for receiving first and second logic signals to control the state of the control device, with the second logic signal in a first predetermined level the first logic signal being capable of switching the control device to the first state when in a first predetermined state and to the second state when in a second predetermined state, the second logic signal when in a second predetermined level overriding the control of the first logic signal to maintain the control device in said second state, whereby either the first or second logic signals are capable of switching the control device to said second state, with the second logic signal overriding the first logic signal in such control.

7. An integrated circuit as recited in claim 6, wherein the pull-up control device is a transistor.

8. An integrated circuit as recited in claim 6, wherein the predetermined logic level is a logic high.

9. An integrated circuit as recited in claim 6, wherein the first predetermined state is a logic low.

10. An integrated circuit as recited in claim 6, wherein the second predetermined state is a logic high.

11. An integrated circuit including a buffer, the buffer comprising:

an output driver, the output driver having an input node at which data is received and an output node at which the data is presented, the output driver for receiving the data and for transferring the data to the output node to be placed on a bus;

a pull-up control device coupled to the output node, the control device capable of being switched between a first state that couples the output node to a predetermined logic level and a second state that does not couple the output node to the predetermined logic level; and control logic coupled to the pull-up control device for receiving first, second and third logic signals to control the state of the control device, with the second logic signal in a first predetermined level the first or third logic signals being capable of switching the control device to the first state when either the first or third logic signals are in a first predetermined state and to the second state when either the first or third logic signals are in a second predetermined state, the second logic signal when in a second predetermined level overriding the control of the first and third logic signals to maintain the control device in said second state, whereby any of the first, second or third logic signals are capable of switching the control device to said second state, with the second logic signal overriding the first and third logic signals in such control.

12. An integrated circuit as recited in claim 11, wherein the pull-up control device is a transistor.

13. An integrated circuit as recited in claim 11, wherein the predetermined logic level is a logic high.

14. An integrated circuit as recited in claim 11, wherein the first predetermined state is a logic low.

15. An integrated circuit as recited in claim 11, wherein the second predetermined state is a logic high.

* * * * *